US007292970B1

(12) United States Patent
Hurlock

(10) Patent No.: US 7,292,970 B1
(45) Date of Patent: Nov. 6, 2007

(54) FINDING UNEXERCISED LOGIC FOR USE IN CODE COVERAGE TESTING

(75) Inventor: Steven T Hurlock, Wynnewood, PA (US)

(73) Assignee: Unisys Corporation, Blue Bell, PA (US)

( * ) Notice: Subject to any disclaimer, the term of this patent is extended or adjusted under 35 U.S.C. 154(b) by 629 days.

(21) Appl. No.: 10/324,451

(22) Filed: Dec. 20, 2002

Related U.S. Application Data

(60) Provisional application No. 60/376,502, filed on Apr. 30, 2002, provisional application No. 60/376,604, filed on Apr. 30, 2002.

(51) Int. Cl.
- *G06F 17/50* (2006.01)
- *G06F 9/455* (2006.01)
- *G06G 7/62* (2006.01)

(52) U.S. Cl. .............................. 703/23; 703/13; 703/14; 703/15; 703/16; 717/124; 717/131; 717/154

(58) Field of Classification Search .................. 703/23, 703/13–16; 717/124, 131, 154
See application file for complete search history.

(56) References Cited

U.S. PATENT DOCUMENTS

| | | | | |
|---|---|---|---|---|
| 6,182,258 B1* | 1/2001 | Hollander | ................... | 714/739 |
| 6,301,688 B1* | 10/2001 | Roy | ................ | 716/4 |
| 6,336,087 B2* | 1/2002 | Burgun et al. | ................. | 703/15 |
| 6,430,741 B1* | 8/2002 | Mattson et al. | ............. | 717/154 |
| 6,530,054 B2* | 3/2003 | Hollander | .................. | 714/739 |
| 6,636,995 B1* | 10/2003 | Dean et al. | ................. | 714/724 |
| 6,836,877 B1* | 12/2004 | Dupenloup | .................. | 716/18 |
| 6,990,438 B1* | 1/2006 | Chowdhury et al. | .......... | 703/13 |
| 7,100,152 B1* | 8/2006 | Birum et al. | ............... | 717/131 |
| 2001/0011212 A1* | 8/2001 | Raynaud et al. | .............. | 703/22 |
| 2002/0095660 A1* | 7/2002 | O'Brien et al. | ............. | 717/127 |

FOREIGN PATENT DOCUMENTS

WO   WO 01/40941    6/2001

OTHER PUBLICATIONS

Liu et al. 'Efficient Coverage Analysis Metric for HDL Design Validation'. IEEE Proceedings—Computers and Digital Techniques—Jan. 2001—vol. 148, Issue 1, p. 1-6.*
Corno et al. 'An RTL Fault Model with High Gate Level Correlation'. IEEE, 2000.*
Jou et al. "Coverage Analysis Techniques for HDL Design Validation" 6th Asia Pacific Conference on cHip Design Languages, 1999.*
Jou et al. "Coverage Analysis Techniques for HDL Design Validation" 6th Asia Pacific Conference on cHip Design Languages, 1999.*
Drako et al. "HDL Verification Coverage" EETimes 1998.*

* cited by examiner

*Primary Examiner*—Kamini Shah
*Assistant Examiner*—Shambhavi Patel
(74) *Attorney, Agent, or Firm*—Richard J. Gregson; Woodcock Washburn LLP

(57) ABSTRACT

A code coverage tool provides that a netlist is instrumented with gates for providing a comparison of an output of the design gates on one cycle with their output on a next cycle to determine if the gate was exercised during an emulation.

15 Claims, 7 Drawing Sheets

IDENTIFYING NETLIST GATES OF SPECIFIED FUNCTION

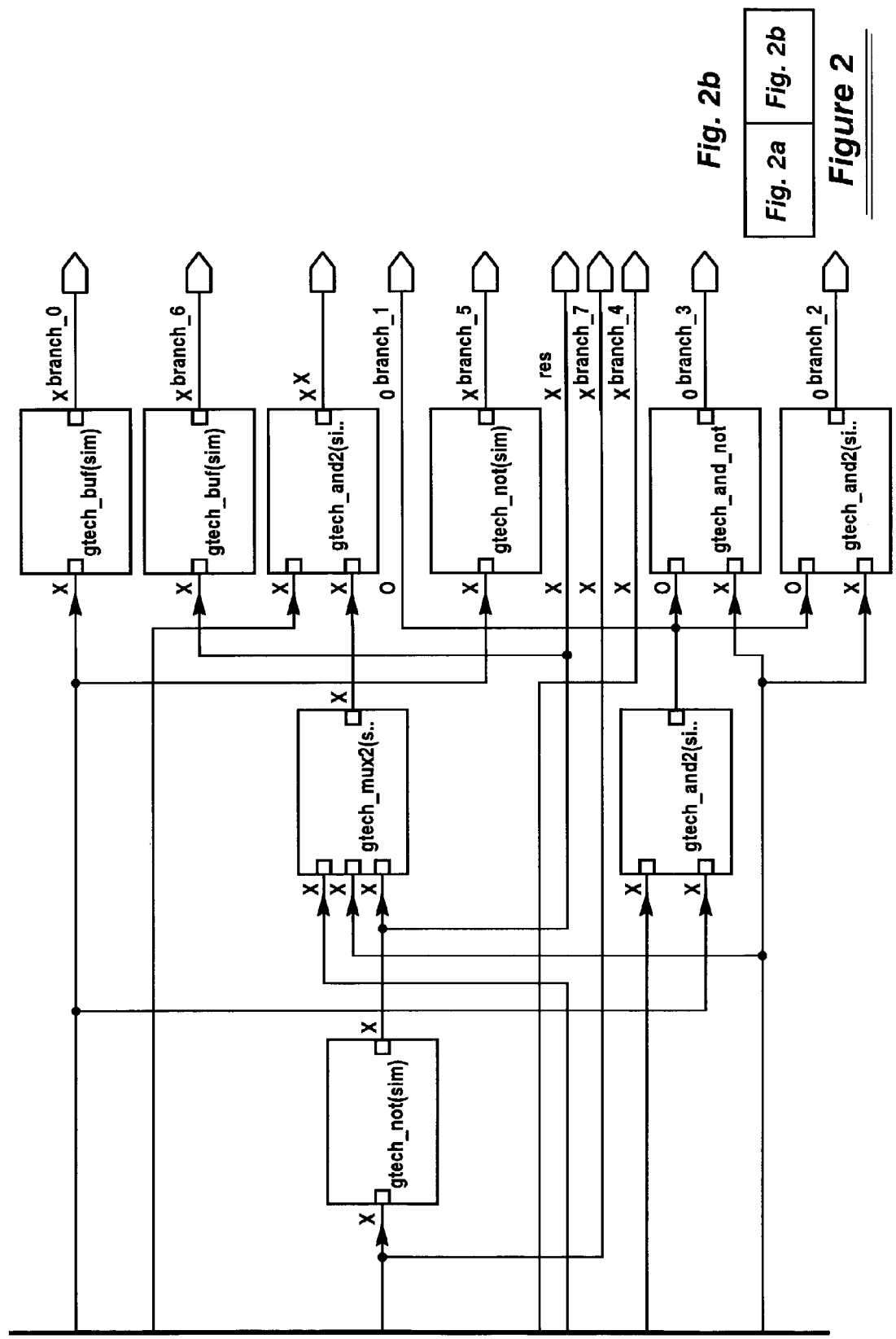

IDENTIFYING NETLIST GATES OF SPECIFIED FUNCTION

FINDING UNEXERCISED LOGIC FOR USE IN CODE COVERAGE TESTING

CROSS-REFERENCE TO OTHER APPLICATIONS

This patent is based on and claims priority from a provisionally filed U.S. Patent Application Ser. No. 60/376,502. It is also related to the provisionally filed U.S. Patent Application Ser. No. 60/376,604. Both those provisional applications were filed on Apr. 30, 2002. Provisional application No. 60/376,604 is related in that it has similar subject matter and a shared inventor. Both of these provisional applications are incorporated in their entireties by this reference thereto. Additionally, this patent is related to the patent entitled Identifying Specific Netlists for use in Code Coverage Testing filed on even date herewith, having substantially similar disclosure and the same inventor, but directed to different subject matter.

COPYRIGHT NOTICE

A portion of the disclosure of this patent document contains material that is subject to copyright protection. The copyright owner has no objection to the facsimile reproduction by anyone of the patent document or the patent disclosure as it appears in the United States Patent & Trademark Office patent file or records, but otherwise reserves all copyright rights whatsoever.

BACKGROUND OF THE INVENTION

1. Field of the Invention

This invention relates generally to hardware design for high density logic circuits and has particular application to code testing in design development, and enhancements thereto.

2. Background

Code coverage is a compute intense activity involved in hardware emulation used in the hardware design process. A fair background description can be found at http://www-.bullseye.com/coverage.html. A great deal of expense and time can be saved with improvements and enhancements to basic code coverage tools.

Specifically, if one can identify specific functional parts of a circuit design, one can direct the emulation of those parts with specificity to ensure adequate code coverage can be accomplished. This is particularly useful where a functional circuit's truth table is complex, and time to emulate for each possible combination is an important consideration. Also, determining which logic gates are unexercised in an emulation is essential to knowing whether the design is adequately tested. The two ideas presented in this patent are directed to these goals.

It is helpful to have some background terms defined.

The most basic is HDL or Hardware Description Language. The most common HDLs in use today are Verilog and VHDL (which stands for VHSIC Hardware Description Language, where VHSIC stands for Very High Speed Integrated Circuit). They describe circuit designs in a technology-independent manner using a high level of abstraction.

A netlist is the HDL description of the hardware design. The netlist includes information on a target technology for the design, but not the physical design. A (usually) separate physical design team will place and route signal paths and get the design to meet the timing requirements of the functionality.

Coverage probes are logical flags placed into the HDL or VHDL where something is happening of interest. If one is "instrumenting" the coverage probes, that means inserting extra VHDL statements that will appear in the instrumented VHDL output file (so the coverage tools have access or hooks into the probes to use them as may be desired.) Because a probe looks like a circuit, it is given a hierarchical name so that it can be found and not confused with any other circuit in the design.

It is also useful to realize that naming conventions are important for finding logic in a large VHDL or Verilog file. Typically there is a hierarchical convention used, where a piece of logic, say, Register W fits within a subset of logic called for example, C within a part of a high level function, say, B, which in turn fits within a larger contextual piece of logic performing that high level function A, and which in turn fits within an even larger contextual piece of an even higher level function, for example, bus controller BC. Thus, the identification of Register W would be "BC:A:B:C: RegisterW." Other naming conventions can be used but generally a hierarchical approach is taken due to its simplicity.

It is also useful to recognize the difference between emulation and simulation, which those who work in these areas assume. Simulation is done in fairly small segments of logic, compared to emulation, and does not require many real-world attributes. An example of Emulation may be that of a software emulation of a testbench for running an entire device (ASIC, or ASIC with components on a circuit board) to determine if it has any faults. At speed testing, real-world device attributes and the like are included in the emulation run, whereas a simulator need only test the functionality of the logic design, and generally works for earlier phases of the design process.

Finally, the term reset trigger has a known meaning. We generally use it in this patent with the meaning it has as something that will reset values of coverage flip-flops to a known state. It is called a "trigger" because it triggers sensitivity lists to capture initial values.

SUMMARY OF THE INVENTION

In the preferred embodiment, an HDL (VHDL, Verilog, etc.) source is instrumented with coverage probes; a hierarchical name is generated for each instantiated probe; the instrumented HDL source is compiled/synthesized into a gate-level netlist; the list of hierarchical names is used to generate two scripts: a reset trigger script, and a probe value extraction script; the instrumented netlist is loaded onto a hardware emulator; the emulation run is initialized, then the generated reset trigger script is executed to reset all branch and statement probes; the fully initialized design is then driven by a testbench; after the testbench has completed, the generated extraction script is run to retrieve the probe values from the emulator; the extracted probe values are saved in a valid input format for use by a code coverage tool; the code coverage tool produces reports detailing how much of the design has been exercised, using the various code coverage techniques.

Coverage can be thought of in parts; Branch coverage, which itself can be described in three parts; Standard, For-Loop and For-Generate; and the additional parts are Statement coverage; and Toggle Coverage. A reset trigger is also included in the description.

An improvement or improvements to this schema described in detail below include how we identify specific netlists and unexercised logic in such netlists for use in code coverage testing. This requires first a the use of a Method to Identify Netlist Gates With Specified Functionality for Use in Lowlevel Netlist Changes, which is preferably followed by a Method to Identify Logic That Will Not Be Exercised in a Simulation Due to Constants. During this second method constants are found in the netlist(s) identified by the first process. Thus, the second process can be dependent upon either the first process (or an equivalent or similar process) to produce the netlist gates with specified functionality. If one desires, the determination can be made of which logic is unexercised without limiting ones search to specified functionality gates and the determination is described that way here within, however, by limiting instrumentation to those gages identified in the first method, a larger netlist can be plumbed for uncovered gates in an identically sized emulator. Accordingly we describe these processes separately in detail below.

BRIEF DESCRIPTION OF THE FIGURES

The present invention is described with reference to the accompanying drawings which are at the pages in the specification mentioned in the paragraphs that follow.

FIGS. 2a and 2b comprise two parts of a block diagram (called FIG. 2);

DETAILED DESCRIPTION OF THE PREFERRED EMBODIMENTS

While various embodiments of the present invention are described, it should be understood that they have been presented by way of example only, and not as a limitation. Thus, the breadth and scope of the present invention should not be limited by any of the above-described exemplary embodiments, but should be defined only in accordance with the following Claims and their equivalents.

Figure 4:
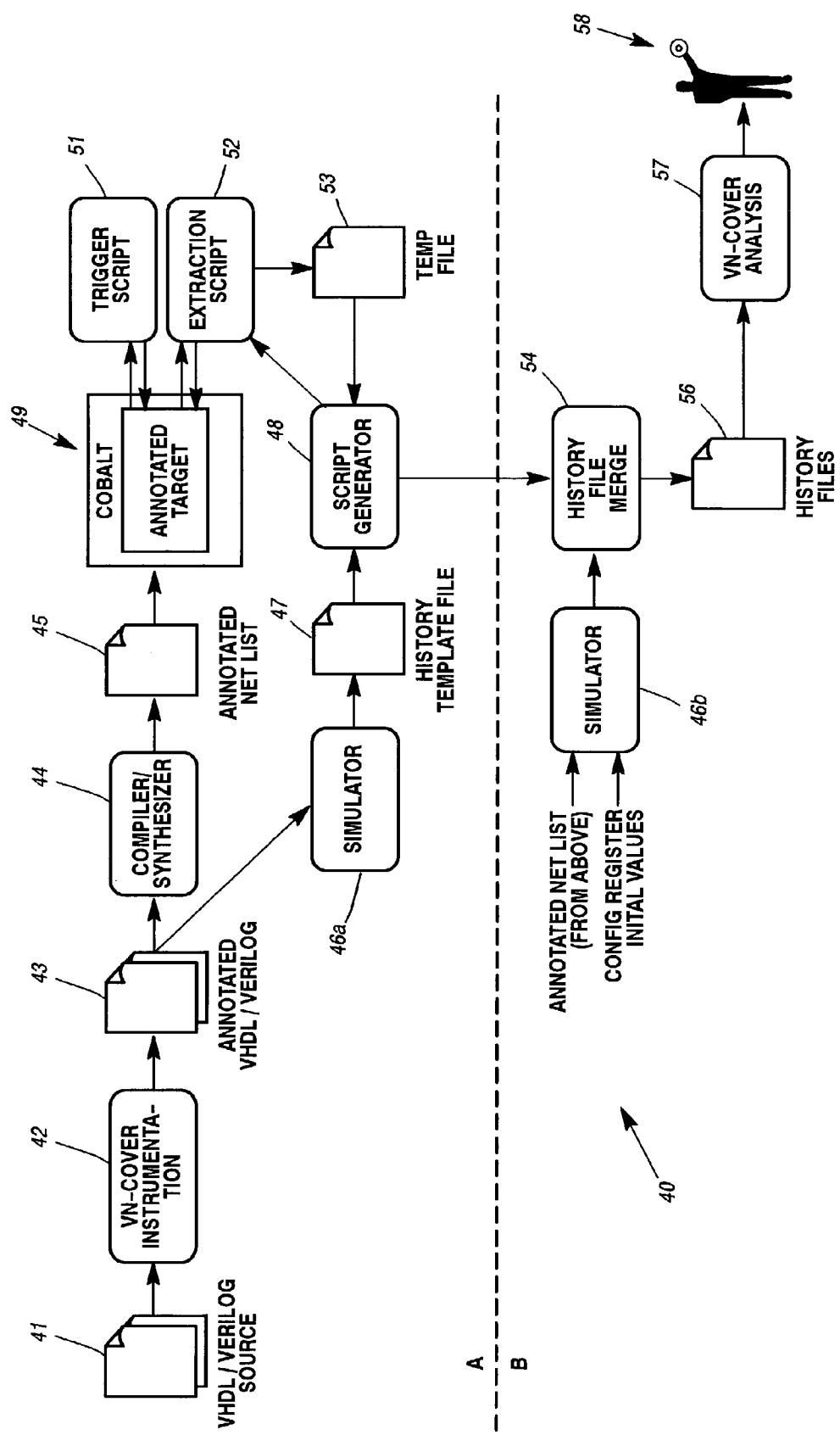
FIG. 4 is a block flow diagram.

Generally, the context in which these inventions are useful should be discussed first. Refer first to FIG. 4 the flow schematic diagram 40. In this figure, it can be seen that the production of the data file that will become the chip (illustrated here on a wafer 58 being held by an appreciative human stick figure) begins with the production of the VHDL/Verilog source files 41. In order to implement the inventions the source file is instrumented in step 42 to create an annotated source file 43. The instrumentation in the preferred embodiment is done using the VN-Cover tool from TransEDA, but other similar tools could be used. (VN stands for VHDL Navigation). The annotated source files 43 are sent to a simulator 46a to give us all the names of the registers we will want to look at, based on the annotations that were made. The simulator will produce a history template file 47 as a result. Preferably contemporaneously the simulation, we run a compiler/synthesizer 44 to produce the annotated net list 45 from the VHDL Verilog files 43, so that the CoBALT engine 49 has something to work with that it understands. The upper flow of processes and software is the Emulation Flow. Trigger Scripts 51 and Extraction scripts 52 interact with the annotated target in CoBALT to improve it to the point where a properly annotated Temp File 53 is created to form the basis for ultimate coverage analysis in block 57. The extraction scripts 52 are created in a script generator 48 that produces a script based on the files input to it (47 and 53). The first file is the history template file 47, created through the simulation 46. After this is used to create an extraction script and that is run on the target in CoBALT, a temporary file 53 is created that holds the data on which circuits we want to look at, but without merging it with the old history template file 47, it is unreadable. The Script generator 48 merges this file 53 with the file 47 to produce a history file merge 54. Using the original annotated netlist, simulation done in simulator 46b generates an output of values based on initial values pushed through the circuits simulated per the annotated net list in simulation. The history file-merge 54 pulls the circuits of interest into a history file 56, and this is the file used as the basis for the code coverage analysis 57. The simulation done in simulator 46a should be run through all register values to produce a complete history file as would be expected by one in this art. Thus, part A of the flow schematic diagram 40 (above the dotted line) has the process components useful for the identification of netlist gates with a specified functionality that one may want to review for code coverage. It is however, a general method which we simplify to identify unused gates in the VNCover process. Part B is mainly concerned with preparing to identify the logic that will not be exercised from among the logic identified in part A. Accordingly, the detailed description is provided in two parts.

Part I

Method to Identify Netlist Gates with Specified Functionality for Use in Lowlevel Netlist Changes Problem Description:

ASIC (Application Specific Integrated Circuit) netlists often need to have small changes added after a given netlist has been created and layed out on the die by the Physical design team due to logic problems found through simulation or code inspection. Since there is a great of work getting the design to this point, these small changes take the form of "ECOs" (Engineering Change Orders), which are small scripts that add or cut wires and change or remove gates. This process can also be done to a limited extent after an ASIC has been fabricated through a process known as FIB, Focused Ion Beam, where the metal layers of an ASIC are physically changed to provide the desired functionality. When designing these changes, the engineer will try to use existing logic to create new signals or terms. However, programmatic synthesis tools create logic that make the process of finding desired combinations of signals and conditions extremely difficult. The method described herein provides a way to find such terms in a complex ASIC netlist.

The following is an example of a problem that was solved with the method:

A change was required in the following logic found inside a VHDL process statement:

```
case REQ2_0 is
    ...
    when BWB => -- writeback op
        if (CT_A4B01MSGACCPT_Q = '1') and
    (YENMMWRDEF_Q = '1') then -- MM wr and defer
```

```
            RS         := DEFD;
            RSP        := '1';
      else
            RS         := NODA;
            RSP        := '0';
      end if;
      . . .
``` where REQ2_0 is a 3 bit register and BWB is a constant of value 5. The desired change was:

```
   case REQ2_0 is
      . . .
      when BWB => -- writeback op
         ---if (CT_A4B01MSGACCPT_Q = '1') and
(YENMMWRDEF_Q = '1') then -- MM wr and defer
            --RS        := DEFD;
            --RSP       := '1';
         --else
            RS          := NODA;
            RSP         := '0';
         --end if;
      . . .
```

To make the change as small as possible, the designer needed to identify, if possible, a signal that was active when REQ2_0(2 down to 0)=5 so that during this time the designer could force the existing logic to always give the behavior in the "else" condition. In the netlist these signals have a large number of destinations so the synthesis tool added many buffers and/or inverters to the logic. This large number of loads makes finding this particular decode very complicated and it is an extremely time consuming task to look at each load of each signal and each buffer.

Solution Description:

The following is an example illustrating how the method works.

1) The level of hierarchy containing the logic to be searched was isolated from the compiled design. That smaller netlist was flattened and ungrouped so that all of the gates in the design were at the same level. (This is a common extraction technique for finding a sub-design known to those of skill in this art). Since the term was 3 bit decode in this example, the search in this case was limited to the output of gates that had less than 3 inputs (AND3, MUX21, etc), the target signal set. A script was created and applied in the synthesis tool (Design Compiler, a Synopsis tool was used in the preferred embodiment but other similar tools are available and could be used) to add one exclusive-or gate (XOR) into the design for each signal in the target signal set. (We note here that it is our common practice to refer to XNOR gates as XOR gates because even thought the truth tables are different, the common thinking about the function is the same and such usage has developed into a shorthand way to talk about such gates. Generally, a comparison function is being done, and the short-handed way to think of it is that if two input signals are the same, the output will be true. Thus, all our early discussions about circuit design use the shorthand XOR, as we do in this paragraph and elsewhere in this document, while the XNOR function is what is meant. Thus, XOR is used herein as a common term for a gate that does a comparison between two bits.)

Each of these signals was tied to one input of one of XOR gates. The other input of each XOR is tied to a new input added to the design (One input for entire design, all XORs tied to this one signal/port). The output of each XOR is tied to a new signal created in the design (one for each XOR). These signals are identified by common prefix and a unique number for each XOR. A VHDL netlist is created as part of the tool's script.

The VHDL netlist is brought up in an event based simulator (NC-SIM for Cadence in this case although any simulator with similar features could be used) using the vendor supplied functional models for the library used (i.e., for the target technology) in the netlist. All inputs and register outputs are forced to the 'X' state, which denotes a conflict. X state is a term we use to mean a known state determined by a known table. X states are commonly used to denote a conflict by practitioners in these arts. Refer to IEEE standard 1164-1993 for details on how X states are used. (The register outputs are forced to X states by re-writing the register model, see the example below. This is not necessary but makes the process quicker by eliminating the need to find all of the names of the registers in the design). Using the X state is a very important part of the method as explained below.

The search is then started. The register bits (could also be input ports) involved in the desired functionality to be found are force to each permutation of the possible values for that number of bits and the extra input TEST input that was added is forced to the outcome value for the desired function. An example:

Say the function is '1' when X=1, Y=0, Z=1 else '0'; The inputs would be:

| X | Y | Z | TEST |
|---|---|---|------|
| 0 | 0 | 0 | 0 |
| 0 | 0 | 1 | 0 |
| 0 | 1 | 0 | 0 |
| 0 | 1 | 1 | 0 |
| 1 | 0 | 0 | 0 |
| 1 | 0 | 1 | 1 |
| 1 | 1 | 0 | 0 |
| 1 | 1 | 1 | 0 |

The first time through, all of the compare signals are examined. Any that have the value of '1' are saved and are examined in the next iteration (this accomplished by the "findeq" Tcl procedure in the examples below). Any signal that makes it to the final iteration, has the desired function.

By using the X state for signal values that can be any value and by using 1's and 0's for signals who values are known, the X resolution function allows logic to be found that is just based on the constant inputs and have no dependence on other unspecified signals. This works because of the resolution function of the X state. A '1' input into an OR gate blocks any other input to the gate; the same is true for a '0' input into an AND gate. However other values to these gates (for an OR: 0 or X) cause the gate to output X which indicates that the gate is dependent on other sources. Thus after all of constant value and X's of the other inputs/registers are propagated through the design, any signal that has a non-X value is dependant only on the set of signals that were given constant values. By forcing each permutation of values for the inputs into the desired function, it is possible to find the signals that are identical to the desired function.

The X state has the following resolution functions:

| | |
|---|---|
| And function: | |
| Input | X 0 1 |
| X | X 0 X |
| Or function: | |
| Input | X 0 1 |
| X | X X 1 |

Features Recitation:
2) Use of XOR gates inserted into gate level netlist to make the search for matching terms efficient.
3) Use of constant values for desired function inputs and X state for all others which allows the simulator to automatically calculate the that wholly dependent on the constant signals.

EXAMPLES AND FIGURES

Figure 1:
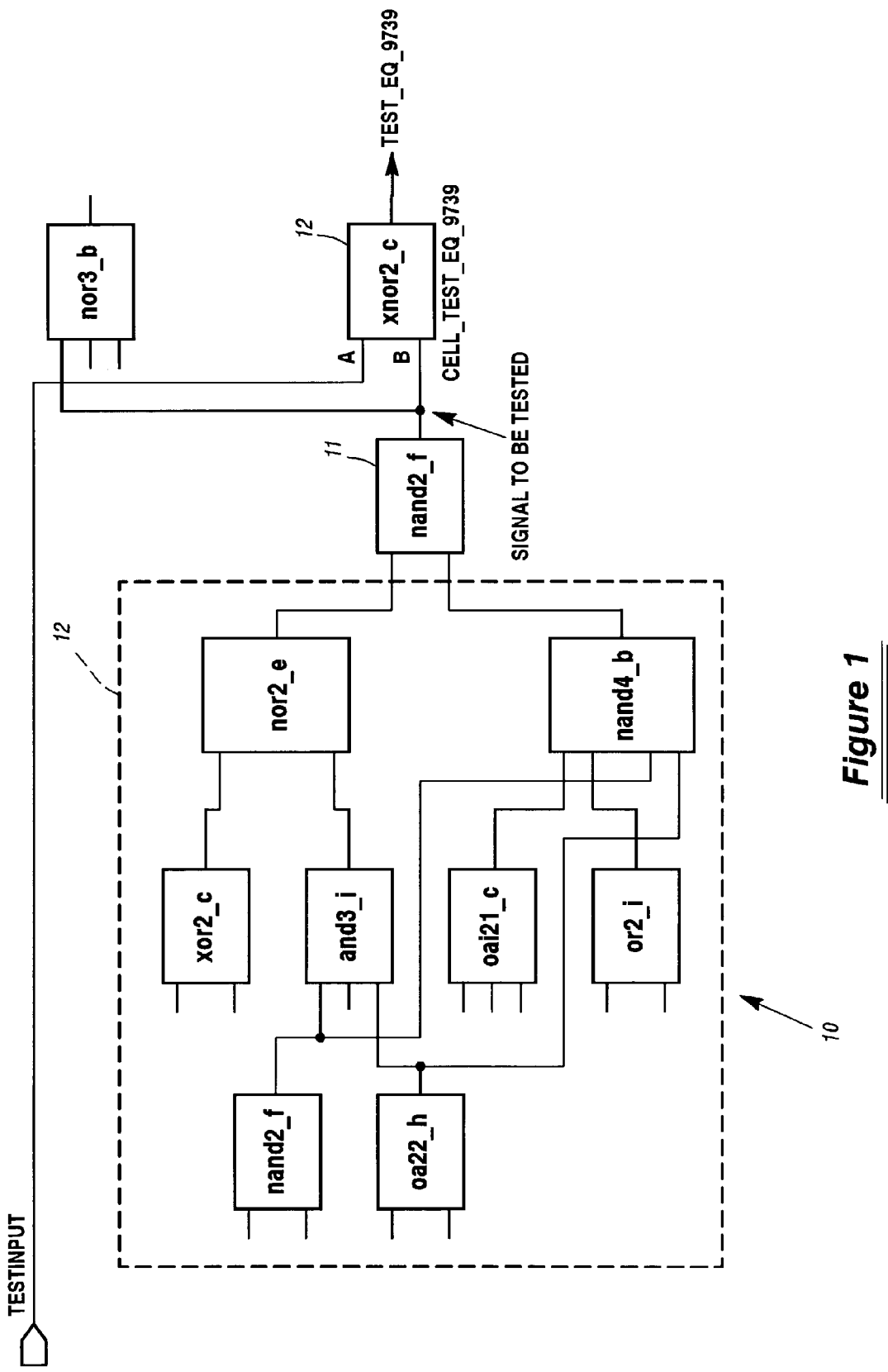
FIG. 1 is a block diagram.

Example of Synopsys dc_shell script using the Synopsis tool to add TESTINPUT port, connect TESTINPUT_net to the port and add an XOR (or in the preferred embodiment XNOR) gate for every net in the target signal set:

create_port TESTINPUT create_net TESTINPUT_net connect_net TESTINPUT_net TESTINPUT create_cell   CELL_TEST_EQ_0   IBM_SA27E_SC/XNOR2_C create_net TEST_EQ_0 connect_net TESTINPUT_net CELL_TEST_EQ_0/A connect_net Z2529EZ CELL_TEST_EQ_0/B connect_net TEST_EQ_0 CELL_TEST_EQ_0/Z create_cell   CELL_TEST_EQ_1   IBM_SA27E_SC/XNOR2_C create_net TEST_EQ_1 connect_net TESTINPUT_net CELL_TEST_EQ_1/A connect_net Z426EZ CELL_TEST_EQ_1/B connect_net TEST_EQ_1 CELL_TEST_EQ_1/Z create_cell   CELL_TEST_EQ_2   IBM_SA27E_SC/XNOR2_C create_net TEST_EQ_2 connect_net TESTINPUT_net CELL_TEST_EQ_2/A connect_net Z4443EZ CELL_TEST_EQ_2/B connect_net TEST_EQ_2 CELL_TEST_EQ_2/Z create_cell   CELL_TEST_EQ_3   IBM_SA27E_SC/XNOR2_C create_net TEST_EQ_3 connect_net TESTINPUT_net CELL_TEST_EQ_3/A connect_net Z136EZ CELL_TEST_EQ_3/B connect_net TEST_EQ_3 CELL_TEST_EQ_3/Z An example of resulting gates in netlist is illustrated in FIG. 1.

(This example is simplified in that it does not illustrate a three input gate per se, but the instrumenting of a two input gate. We prefer to cover code for two input gates because a three input gate with a stuck-at or otherwise unchanging input will be equivalent to it and we feel that even though our target is a three input gate, finding two input gates is appropriate. For example, if a three input AND gate feeds one input to a two input AND gate, and one of the inputs to the three input AND is stuck at hi, the two gates together will be mathematically equivalent to the kind of three input gate we are looking for in the TEST example described by the truth table above.) IN FIG. 1, a set of logic gates 10 is illustrated, being a cloud 12 and the gate of interest 11. Thus, for code coverage we want to know the output of gate 11, i.e., that is the signal to be tested. We instrument the descriptive code to add the gate 12, and provide test input to input A of gate 12 (an XNOR called 2_c). The output is TEST_EQ_9739, and this is the value we use to determine the function of circuit (gate) 12. Since we control the test input line, the output will be the same as B when we want to know it.

Example of Vender supplied functional register model modified to give X output:

(This is used as a shortcut because otherwise we would have to supply all the inputs as indicated in next examples below).

```
library IEEE;
use IEEE.STD_LOGIC_1164.all;
entity LMX0001_E is
    port(
    L2        : out STD_LOGIC;
    A         : in STD_LOGIC;
    B         : in STD_LOGIC;
    C         : in STD_LOGIC;
    D0        : in STD_LOGIC;
    D1        : in STD_LOGIC;
    I         : in STD_LOGIC;
    SD        : in STD_LOGIC);
end LMX0001_E;
architecture ARCH_FUNC of LMX0001_E is
begin
L2 <= 'X';
end ARCH_FUNC;
```

Example of Tcl script used to force all inputs to X state which must be used where no cell model is provided:

```
proc force_inputs {} {
   force TEST_CLKA_XX X
   force TAGUPDT_REG_CLKA X
   force TAGUPDT_REG_SDI X
   force QARBS_REG_CLKA X
   force QARBS_REG_SDI X
   force TEST_CLKBP X
   force TEST_CLKC_C4 X
   force CLK_C4 X
   force SDI X
   force CT_RESET X
   force YBANKDIS_3_port X
   force YBANKDIS_2_port X
   force YBANKDIS_1_port X
   force YBANKDIS_0_port X
   force YENTAGECCDET_Q X
. . .
}
```

Example of Tcl scripts used in cadence ncsim to find a list of gates that provide as output signals with the desired functionality from the truth table for such gates:

```
set TheList { }
proc create_list {ntestpoints} {
        global TheList
        for {set i 0} {$i < $ntestpoints} {incr i} {
                        lappend TheList TEST_EQ_$i
        }
}
proc findeq { } {
        global TheList
        set newList { }
        puts "len = [llength $TheList]"
        # puts "TheList = $TheList"
        for {set i 0} {$i < [llength $TheList]} {incr i} {
                set el [lindex $TheList $i]
                ##puts "$1 = $el"
                if { [string compare [value $el] b1] == 0} {
                        lappend newList $el
                }
        }
        # puts "newList = $newList"
        set TheList $newList
        # puts $TheList
}
proc s {value } {
        set test0 1
        set g [expr ($value >> 6) & 1]
        set f [expr ($value >> 5) & 1]
        set e [expr ($value >> 4) & 1]
        set d [expr ($value >> 3) & 1]
        set c [expr ($value >> 2) & 1]
        set b [expr ($value >> 1) & 1]
        set a [expr $value & 1]
        puts "$d $a $b $c"
        # force current iteration value here
        force -freeze TC_A4B_0_10_TQ_A4B01CMDREG_FF_0:L2 $a
        force -freeze TC_A4B_0_10_TQ_A4B01CMDREG_FF_1:L2 $b
        force -freeze TC_A4B_0_10_TQ_A4B01CMDREG_FF_2:L2 $c
        # force -freeze      TC_A4B_0_10_TQ_A4B01TTCODE_FF_0:L2 $a
        # force -freeze      TC_A4B_0_10_TQ_A4B01TTCODE_FF_1:L2 $b
        # force -freeze      TC_A4B_0_10_TQ_A4B01TTCODE_FF_2:L2 $c
        # force -freeze      TC_A4B_0_10_TQ_A4B01TTCODE_FF_3:L2 $d
        # force -freeze      TC_A4B_0_10_TQ_A4B01TTCODE_FE_4:L2 $e
        # force -freeze TC_A4B_0_10_TQ_A4B01TYPE_FF_0:L2 $a
        # force -freeze TC_A4B_0_10_TQ_A4B01TYPE_FF_1:L2 $b
        # force -freeze TC_A4B_0_10_TQ_A4B01TYPE_FF_2:L2 $c
        # force -freeze TC_A4B_0_10_TQ_A4B01TYPE_FF_3:L2 $d
        # force -freeze TC_A4B_0_10_TQ_A4B01TYPE_FF_4:L2 $e
        # force -freeze TC_A4B_0_10_TQ_A4B01CMDREG_FF_2:L2 $c
        # force -freeze TC_A4B_0_10_TQ_A4B01MSGACCPT_FF:L2 $d
        # force -freeze TC_A4B_0_10_TQ_A4B01MSGBUSY_FF:L2 $d
        if { ($value & 7) == 5) }
                force -freeze testinput 1
        } else {
                force -freeze testinput 0
        }
        run 1 ns
        return
}
proc testall { {n 8} } {
        global TheList
        for {set i 0} {$i < $n} {incr i} {
                puts "$i -----------"
                s $i
                findeq
        }
        puts "len = [llength TheList]"
        puts "TheList = $TheList"
}
create_list 9610
```

Note: "#" means that statement is a comment or remark.
Force - freeze is an ncsim construct of Tcl
Tcl is well known tool command language described in detail at http://www.tcl.tk/

Figure 5:
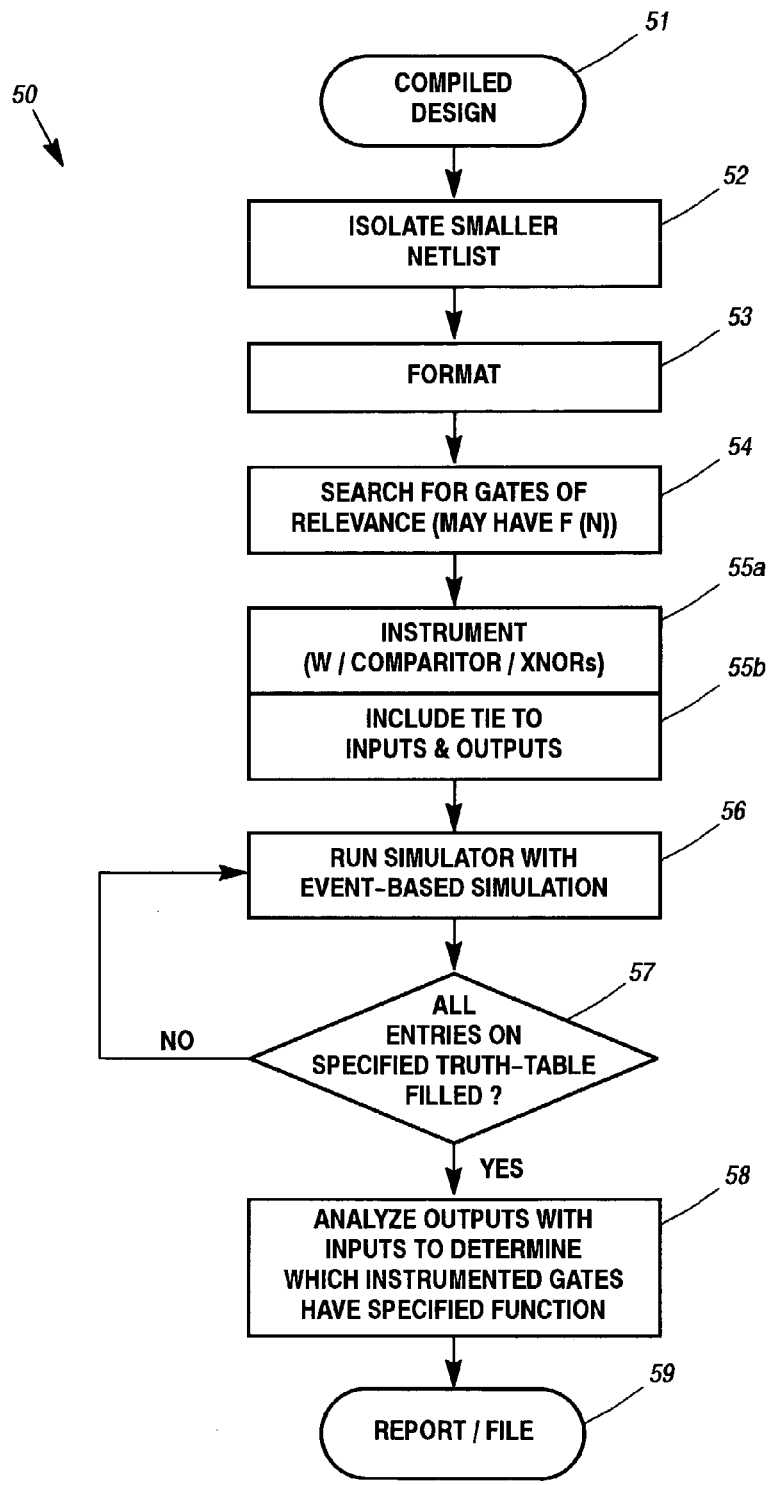
FIG. 5 is a flow chart for a preferred form of the embodiment for identifying specific functions.

Specifically then, this Part I describes a method for identifying netlist gates with specified functionality which can be used by a code coverage tool. An example has been provided above. It can be thought of in more general terms with reference to the flow chart 50 of FIG. 5. First, we isolate, from a compiled design file 51, a level of hierarchy containing the logic to be searched, thus producing a smaller netlist 52 to work with. Then we format the file 53, flattening and ungrouping all gates in said smaller netlist so that all gates with having signals in a target signal set are on a same level. We limit the search to gates with output which meets the intended criteria, finding all the gates which may have the function we seek 54. For the gates we have found in the search 54, we add design elements to the smaller netlist in a synthesis tool to add one exclusive-nor gate (XNOR) into the smaller netlist for each said output signal which meets said intended criteria in the target signal set 55a, and tying one input of said one XNOR to said output signal 55b. (Using a naming convention consistent with the format we produced in step 53, and sending the data to the appropriate software module, we can have the software do this automatically, of course). In instrumenting the netlist, we tie other input of said one XNOR to a new input added to the design such that there is one new input for entire design, and all said one XNORs are tied to this one new input, and we tie the output of each one XNOR to a new XNOR output signal created in the design, such that there is one said new XNOR output signal for each XNOR. We identify these signals by common prefix and a unique number for each XNOR to create a VHDL netlist 58. This netlist thus contains information on all the instrumented gates, letting us know which circuits have the specified functionality. However, without simulating them and tracking their output (the purpose of the instrumentation) we don't know for sure that they have the right functionality. Therefore, we simulate the VHDL netlist in an event based simulator to identify all gates instrumented with the one XNORs 56, to identify all gates instrumented with the one XNORs so as to determine if all gates with said specified functionality do in fact match the truth tables for the specified function we are seeking. After we have completed this simulation 57, we can analyze the outputs with inputs to confirm the truth tables match 58, and generate a report or file 59 to complete this valuable process. The report may also (or separately) include data indicating how many gates have the specified function or what number of gates have the specified function, as may be desired.

Part II

Method to Identify Logic that Will not be Exercised in a Simulation Due to Constants Problem Description:

The problem being solved is part of a larger effort by to develop a code coverage solution for use on logic emulators. One part of that effort is the problem of identifying logic that will not be exercised by tests because the logic is gated by 1) signals tied to constant values or 2) registers that are initialized to a given value and are held at this value for duration of the simulation. This second class are often referred to as "switches" or configuration registers because they determine a mode in which the logic can be operated. The code coverage tool mentioned in PART I, instruments a logic design by adding signals (called Probes) into various points in the design; these signals are then tied to registers that record statistics when the logic is exercised. The entire signal/register unit may be called a probe too, and the register is given a hierarchical name so it can be found and used. (See description of FIG. 1 above for detail). The method outlined below is a process that allows the probes that will not be exercised during the course of simulation due to gating by signals tied to constant values or signals controlled by "switches" to be identified so that they can be covered.

Solution Description:

The solution is based on the following observation from Part I

"By using the X state for signal values that can be any value and by using 1's and 0's for signals who values are known, the X resolution function allows logic to be found that is just based on the constant inputs and have no dependence on other unspecified signals. This works because of the resolution function of the X state. A '1' input into an OR gate blocks any other input to the gate; the same is true for a '0' input into an AND gate. However other values to these gates (for an OR: 0 or X) cause the gate to output X which indicates that the gate is dependent on other sources. Thus after all of constant value and X values of the other inputs/registers are propagated through the design, any signal that has a non-X value is dependant only on the set of signals that were given constant values This last sentence contains the solution to the problem.

To execute the method on the list of registers that are provided by the designers, there are about seven steps. Typically, configuration registers will have a different naming convention to distinguish them from function registers. The method is as follows:

1) The values of all registers to be used as switches for the given simulation are obtained.
2) The HDL code is synthesized to a gate level netlist that has simulation models available for the gates used in the netlist.
3) The netlist is brought into an event-based simulator using the functional gate models. This is necessary because netlists are synthesized without regard to process sensitivity lists. Using the normal HDL code in the simulation could result in erroneous results.
4) All inputs and register output are forced to the X state.
5) The switch registers are forced to their constant values.
6) All signals that are expected to be tied high or low must be in the expected state (Synthesis tools should instantiate logic_0 or logic_1 cells to give the proper values but in some cases where this does not happen this will need to done in the simulation).
7) Then the simulation is run and all probe signals are examined; any probe signals that do not have an X value are dependant only on switches or signals that are tied high or low and will not be exercised by any tests run on the simulation.

Features Recitation:

1) The use of the X state and constant values to determine which probes signals will not be activated. In other words, constant values propagating through the design block out X's so we need to find which ones block the X state to determine which parts of the design are uncovered.

Here is the new method that enables the recited feature:

1) The values of all registers to be used as switches for the given simulation are obtained.

2) The HDL code is synthesized to a gate level netlist that has simulation models available for the gates used in the netlist.

3) The netlist is brought into an event based simulator using the functional gate models. This necessary because netlists are synthesized without regard to process sensitivity lists. Using the normal HDL code in the simulation could result in erroneous results.

4) All inputs and register output are forced to the X state.

5) The switch registers are forced to their constant values.

6) All signals that are expected to be tied high or low must be in the expected state (Synthesis tools should instantiate logic_0 or logic_1 cells to give the proper values but in some cases where this does not happen this will need to done in the simulation).

7) Then the simulation is run and all probe signals are examined; any probe signals that do not have an X value are dependant only on switches or signals that are tied high or low and will not be exercised by any tests run on the simulation. Probe values of 1's would be marked as covered in the event-based simulator, value=0 are the probes that will never be entered because they are inaccessible due to the constant registers or tie-offs.

Note that in this second set of statements about the method, only the last sentence is changed from the first set of statements. In this second statement, we don't have to cover all the circuits which saves very large amounts of computing time and engineering time while still finding those parts of the encoded design are not properly covered by the ordinary code coverage tool processing.

We now provide two code examples and related gate level diagrams to explain how this works in context. This basically provides a way of making the simulator trace through the hierarchy. The two essential points here are 1) simulating the gate level netlist because the it allows all branches of a given process to be examined at one time and 2) using X's on all non constant inputs and register values.

Figures 2, 2A:
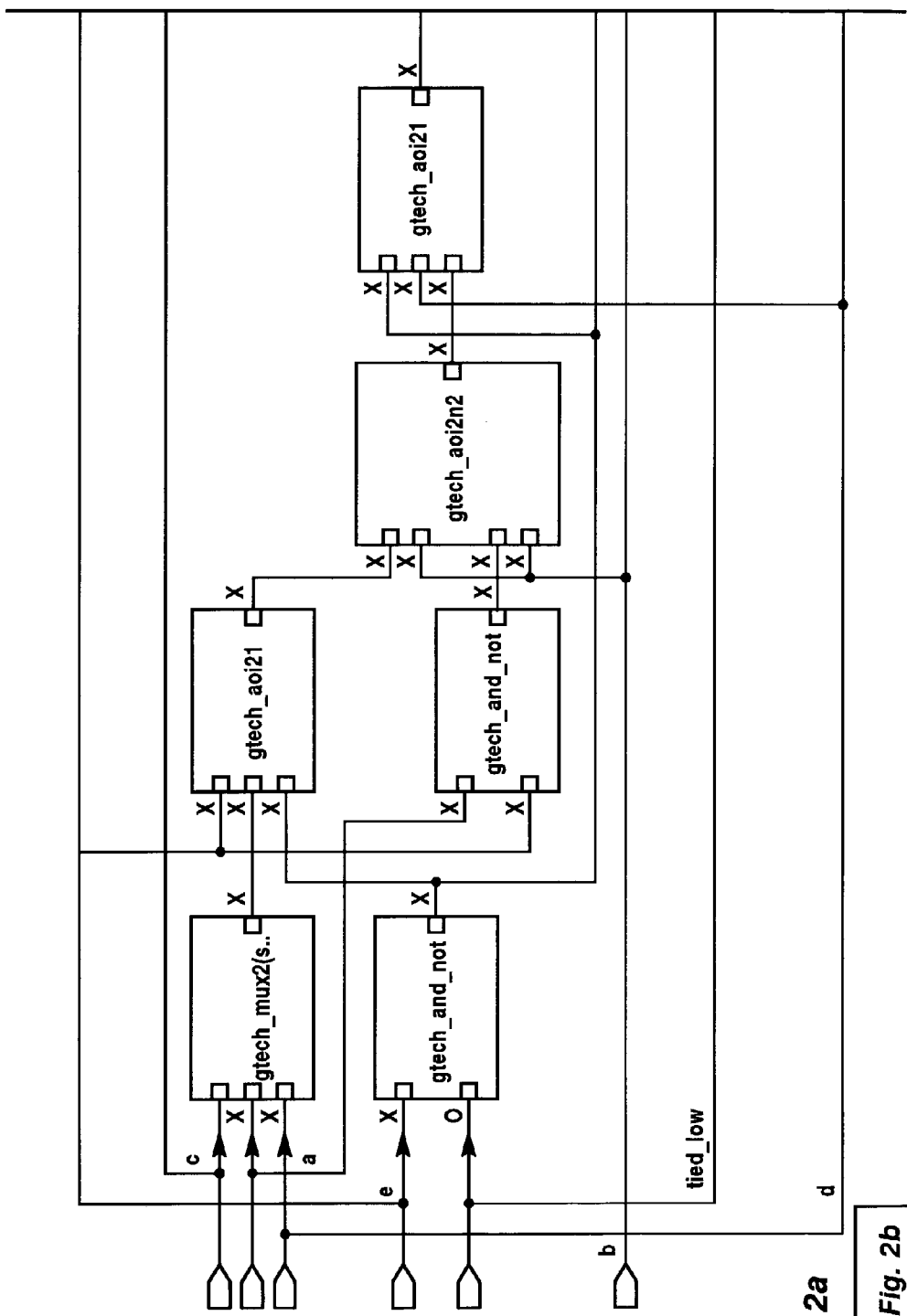
Figure 3:
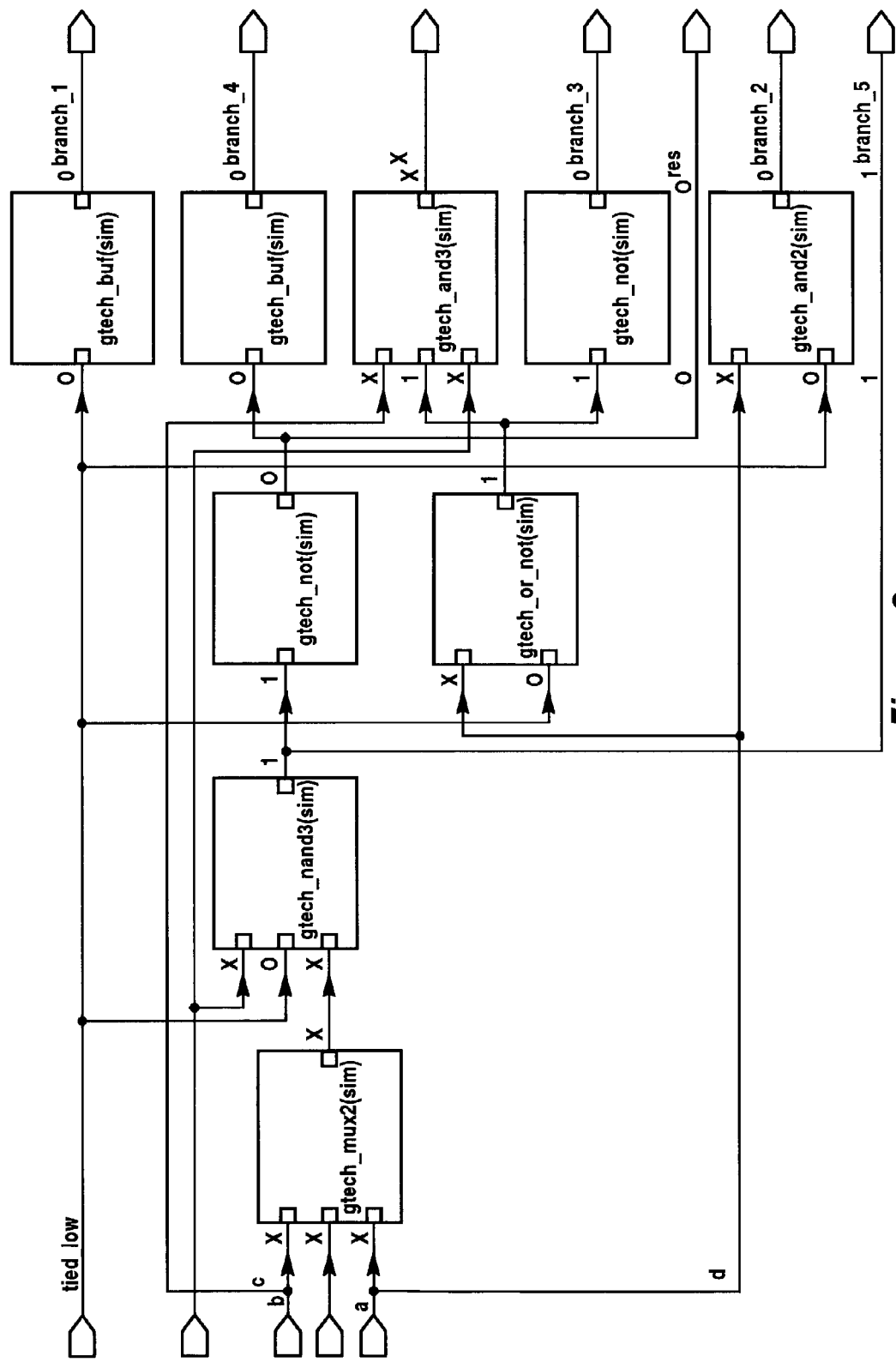
FIG. 3 is a block diagram.

FIG. 2 is related to the code in Tie Test Example 1, and FIG. 3. is related to code from the Tie Test Example 2. Note that in each code example, there is an IF statement where the branch 0 is tied low, switching off the logic related to that branch 0. For most simulation therefore, such segments of logic defined in this if loop will not need to be exercised as it is typically used for test conditions or under special circumstances, but it is included for sake of completeness of the example, and could be run if desired.

Note that in FIGS. 2 and 3, the term GTECH refers to Generic Technology, meaning simply that it does not have all the features such as vendor-specific qualities incorporated into the circuit block at this phase of the design.

Tie_Test Example 1

```
library ieee;
use ieee.std_logic_1164.all;
entity TIE_TEST is
  port (
    tied_low : in std_logic;
    res : buffer std_logic;
    a,b,c,d,e : in std_logic;
    x : buffer std_logic;
    branch_0 : buffer std_logic;
    branch_1 : buffer std_logic;
    branch_2 : buffer std_logic;
    branch_3 : buffer std_logic;
    branch_4 : buffer std_logic;
    branch_5 : buffer std_logic;
    branch_6 : buffer std_logic;
    branch_7 : buffer std_logic
    );
end entity;
architecture RTL of TIE_TEST is
begin
  process(tied_low, res, a, b, c, d)
  begin
    branch_0 <= '0';
    branch_1 <= '0';
    branch_2 <= '0';
    branch_3 <= '0';
    branch_4 <= '0';
    branch_5 <= '0';
    res <= '0';
    if e='1' then
      branch_0 <= '1';
      if tied_low='1' then
        branch_1 <= '1';
        if d='1' then
          branch_2 <= '1';
          res <= a and b;
        else
          branch_3 <= '1';
          res <= b and c;
        end if;
      else
        branch_4 <= '1';
        res <= b or d;
      end if;
    else
      branch_5 <= '1';
      res <= a and not b;
    end if;
  end process;
  process(res, c, d, b)
  begin
    branch_6 <= '0';
    branch_7 <= '0';
    if res='1' then
      branch_6 <= '1';
      x <= c and d;
    else
      branch_7 <= '1';
      x <= b and c;
    end if;
  end process;
end rtl;
```

Tie Test Example 2 VHDL

```
library ieee;
use ieee.std_logic_1164.all;
```

```
entity TIE_TEST is
  port (
    tied_low : in std_logic;
    res : buffer std_logic;
    a,b,c,d,e : in std_logic;
    x : buffer std_logic;
    branch_0 : buffer std_logic;
    branch_1 : buffer std_logic;
    branch_2 : buffer std_logic;
    branch_3 : buffer std_logic;
    branch_4 : buffer std_logic;
    branch_5 : buffer std_logic;
    branch_6 : buffer std_logic;
    branch_7 : buffer std_logic
  );
end entity;

architecture RTL of TIE_TEST is begin
  process(tied_low, res, a, b, c, d)
  begin
    branch_0 <= '0';
    branch_1 <= '0';
    branch_2 <= '0';
    branch_3 <= '0';
    branch_4 <= '0';
    branch_5 <= '0';
    res <= '0';
    if e='1' then
      branch_0 <= '1';
      if tied_low='1' then
        branch_1 <= '1';
        if d='1' then
          branch_2 <= '1';
          res <= a and b;
        else
          branch_3 <= '1';
          res <= b and c;
        end if;
      else
        branch_4 <= '1';
        res <= b or d;
      end if;
    else
      branch_5 <= '1';
      res <= a and not b;
    end if;
  end process;
  process (res,c,d,b)
  begin
    branch_6 <= '0';
    branch_7 <= '0';
    if res='1' then
      branch_6 <= '1';
      x <= c and d;
    else
      branch_7 <= '1';
      x <= b and c;
    end if;
  end process;

end rtl;
```

Figure 6:
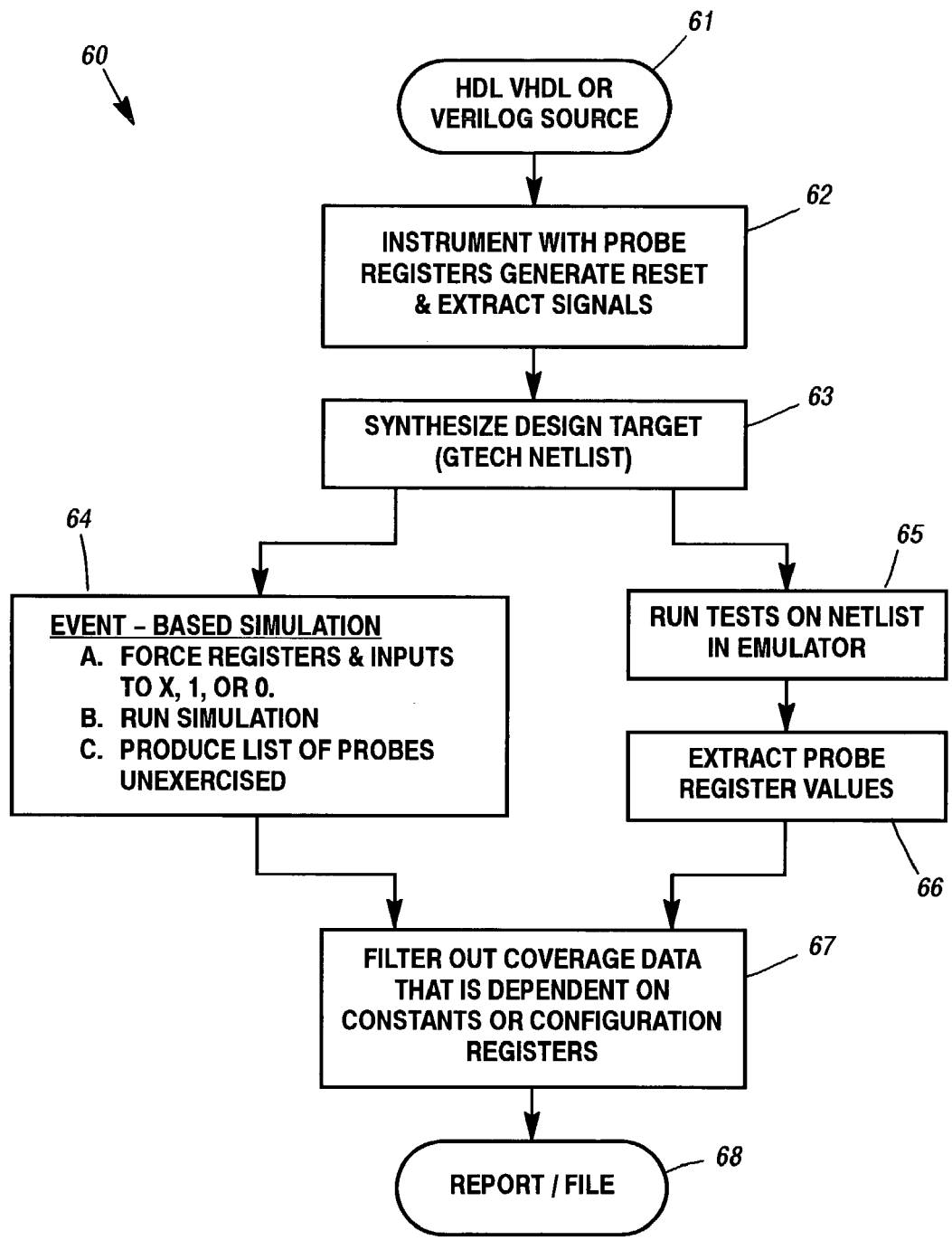
FIG. 6 is a flow chart for a preferred form of the embodiment for finding unexercised logic.

Refer now to FIG. 6 in which the general process 60 for finding unexercised logic is described. We start with the source file 61, and instrument it 62 with probe registers for all the gates. In doing so the reset and extract signals and paths are also constructed, and all this can be done automatically with the software. Once this is completed, we synthesize the target netlist for the design 63, using our generic technology gates (GTECH), as mentioned earlier. At this point there are two branches, event based simulation and emulation testing of the netlist. From the first branch 64, we want to determine which gates are unexercised, producing a set of probes that have not changed their values from the initial value (C), and from the second 65, we want to extract the probe register values themselves (66). Then we can filter out coverage data that is dependent on constants or configuration registers, as we describe in step 7 of the outlined steps above. The final report or file will preferably have a list of uncovered circuits 68, from which a designer can assess the validity of the design, and do further testing. It may also indicate a percentage of gates that are uncovered or a ratio of uncovered to covered gates or just a number of uncovered gates, as may be desired. Logic unexercised due to constants can be modified to be more testable, or ignored, if it is only used for limited purposes and the purpose can be tested through reconfiguration of date inputs.

It will be recognized by those of ordinary skill in these arts that the ideas described herein have applicability generally to hardware design for high density logic circuits and that it has particular application to code testing in design development, and enhancements thereto, regardless of the particular software and hardware environment and that the ambit of the invention is therefore only limited by the claims. With the invention described above the applicant sets forth the following claims.

What is claimed is:

1. A method of employing code coverage having a flow as follows:

instrumenting a design source file with coverage probes;
generating a hierarchical name for each coverage probe;
synthesizing the instrumented design source file into a gate-level netlist; the list of hierarchical names is used to generate two scripts, a reset trigger script to initiate coverage testing, and a probe extraction script to identify to the user which gates are uncovered;
using said reset trigger script, running an event-based simulation of the design source file using functional gate models to produce a list of unexercised probes;
also running the gate-level netlist in a hardware emulator with the probe extraction script to extract probe register values; and
extracting and saving the extracted probe register values (and names) into a history file having a valid input format for use by a code coverage tool, wherein both the list of unexercised probes from the simulation and the extracted probe register values from the hardware emulation are analyzed for code coverage in the code coverage tool.

2. The method of claim 1 further comprising; producing code coverage tool reports, based on said list of unexercised probes and extracted probe values.

3. The method of claim 2 wherein at least one of said reports identifying netlist gates that will not be exercised in a simulation due to constants.

4. The method of claim 2 further comprising producing a file of all netlist gate names identified in said producing step.

5. The method of claim 2 wherein to produce said code coverage report, an analysis step filters out coverage data that is dependent on constants or configuration registers based on reviewing data in said list of unexercised probes and in said history file.

6. An electronic data file containing said report produced in claim 2.

7. The method of claim 1 wherein the instrumenting is done with flip-flop registers on outputs of all gates.

8. The method of claim 1 wherein the list of probes unexercised is derived by comparing a signal output from a gate in one cycle to an output of the same gate on a next cycle in said simulation step.

9. The method of claim 1 wherein the source is a file in HDL, VHDL, or Verilog.

10. A software toolkit for employing code coverage comprising:

program means for instrumenting a design source file with coverage probes;

program means for generating a hierarchical name for each coverage probe, synthesizing the instrumented design source file into a gate-level netlist, the list of hierarchical names is used to generate two scripts, a reset trigger script to initiate coverage testing, and a probe extraction script to identify to the user which gates are uncovered;

program means for using said reset trigger script, running an event-based simulation of the design source file using functional gate models to produce a list of unexercised probes;

program means for also running the gate-level netlist in a hardware emulator with the probe extraction script to extract probe register values; and program means for extracting and saving the extracted probe register values (and names) into a history file having a valid input format for use by a code coverage tool, wherein both the list of unexercised probes from the simulation and the extracted probe register values from the hardware emulation are analyzed for code coverage in the code coverage tool.

11. The software toolkit of claim 10, further comprising; program means for producing by the code coverage tool reports, based on said list of unexercised probes and extracted probe values, at least one of which reports identifies netlist gates that will not be exercised in a simulation due to constants.

12. The software toolkit of claim 10 further comprising program means for producing a file of all netlist gate names identified in said producing step.

13. The software toolkit of claim 10 wherein the program means for instrumenting a design source file with coverage probes inserts flip-flop registers on the outputs of all gates.

14. The software toolkit of claim 10 wherein the program means to produce said code coverage report employs an analysis algorithm that finds coverage data related to gates which are dependent on constants or configuration registers, and conducts this analysis based on reviewing data in said list of unexercised probes and data in said history file.

15. The software toolkit of claim 10 wherein the list of probes unexercised is derived by an additional instrumentation added by said program means for instrumentation, said additional instrumentation for comparing a signal output from a gate in one cycle to an output of the same gate on a next cycle during said simulation.

* * * * *